(12) United States Patent
Kaneshiro et al.

US008298366B2

(10) Patent No.: US 8,298,366 B2
(45) Date of Patent: Oct. 30, 2012

(54) ADHESIVE SHEET AND COPPER-CLAD LAMINATE

(75) Inventors: Hisayasu Kaneshiro, Kyoto (JP); Takashi Kikuchi, Shiga (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 13/221,358

(22) Filed: Aug. 30, 2011

(65) Prior Publication Data

US 2011/0308725 A1   Dec. 22, 2011

Related U.S. Application Data

(63) Continuation of application No. 11/664,311, filed as application No. PCT/JP2005/018018 on Sep. 29, 2005, now abandoned.

(30) Foreign Application Priority Data

Oct. 5, 2004   (JP) ................................ 2004-292949

(51) Int. Cl.
*B32B 37/00* (2006.01)
*B29C 65/00* (2006.01)

(52) U.S. Cl. .................................... 156/324; 156/308.2

(58) Field of Classification Search ............... 156/307.1, 156/307.7, 308.2, 309.6, 324; 428/458, 473.5
See application file for complete search history.

(56) References Cited

U.S. PATENT DOCUMENTS

| | | | | |
|---|---|---|---|---|
| 5,744,286 A | * | 4/1998 | Choi | 430/326 |
| 6,596,968 B2 | * | 7/2003 | Yamamoto et al. | 219/121.71 |
| 2002/0045033 A1 | | 4/2002 | Uhara et al. | |
| 2003/0212245 A1 | * | 11/2003 | Tokuhisa et al. | 528/332 |
| 2004/0010113 A1 | | 1/2004 | Uhara et al. | |
| 2004/0058172 A1 | | 3/2004 | Summers et al. | |
| 2004/0067349 A1 | | 4/2004 | Okamura et al. | |
| 2004/0099374 A1 | * | 5/2004 | Kanakarajan | 156/345.1 |
| 2005/0121138 A1 | | 6/2005 | Hoshida et al. | |
| 2006/0063016 A1 | | 3/2006 | Ko et al. | |
| 2006/0154037 A1 | | 7/2006 | Shimokawa et al. | |

FOREIGN PATENT DOCUMENTS

| | | | |
|---|---|---|---|
| JP | 04266082 A | * | 9/1992 |
| JP | 4-325562 | | 11/1992 |
| JP | 06/232553 | | 8/1994 |
| JP | 7-41556 | | 2/1995 |
| JP | 10-126019 | | 5/1998 |
| JP | 10-130594 | | 5/1998 |
| JP | 2000-058989 | | 2/2000 |
| JP | 2000/080178 | | 3/2000 |
| JP | 2002-138144 | | 5/2002 |
| JP | 2002/201272 | | 7/2002 |
| JP | 2002/249581 | | 9/2002 |
| JP | 2002/280684 | | 9/2002 |
| JP | 2003/071982 | | 3/2003 |
| JP | 2003-206353 | | 7/2003 |
| JP | 2004-115799 | | 4/2004 |
| JP | 2004-269675 | | 9/2004 |

OTHER PUBLICATIONS

English Abstract of JP 2004-269675, Kikuchi, Sep. 2004.
English Machine Translation of JP 2004-269675, Kikuchi, Sep. 2004.
International Search Report, Jan. 17, 2006, (2 pgs).
Patent Abstracts of Japan, Publication No. 2004-269675, Sep. 30, 2004 (1 pg).
Patent Abstracts of Japan, Publication No. 10-130594, May 19, 1998 (2 pg).
Patent Abstracts of Japan, Publication No. 10-126019, May 15, 1998 (2 pg).
Patent Abstracts of Japan, Publication No. 7-41556, Feb. 10, 1995 (1 pg).
Patent Abstracts of Japan, Publication No. 2003-206353, Jul. 22, 2003 (1 pg).
Patent Abstracts of Japan, Publication No. 2002-138144, May 14, 2002 (2 pg).
Patent Abstracts of Japan, Publication No. 4-325562, Nov. 13, 1992 (2 pg).
Patent Abstracts of Japan, Publication No. 2002-249581, Sep. 6, 2002 (1 pg).
Patent Abstracts of Japan, Publication No. 2002-201272, Jul. 19, 2002.
Patent Abstracts of Japan, Publication No. 06-232553, Aug. 19, 1994 (1 pg).
Patent Abstracts of Japan, Publication No. 2002-280684, Sep. 27, 2002 (1 pg).
Patent Abstracts of Japan, Publication No. 2003-071982, Mar. 12, 2003 (1 pg).
Patent Abstracts of Japan, Publication No. 2000-080178, Mar. 21, 2000 (1 pg).
International Preliminary Report on Patentability, issued Apr. 11, 2007 (6 pgs).
English-language machine translation of JP 2000-058989, 4 pgs.

* cited by examiner

*Primary Examiner* — John Goff
(74) *Attorney, Agent, or Firm* — Kagan Binder, PLLC

(57) ABSTRACT

Disclosed is an adhesive film having high dimensional stability which can be suitably used for two layer FPCs. Specifically, disclosed is an adhesive sheet composed of an insulating layer and an adhesive layer arranged on one side or both sides of the insulating layer. This adhesive sheet is characterized in that the insulating layer has a ratio E'2/E'1 between the storage elasticity modulus E'1 at 25° C. and the storage elasticity modulus E'2 at 380° C. of not more than 0.2 and a coefficient of thermal expansion in the MD direction of 5-15 ppm at 100-200° C. It is further characterized in that the change in the coefficient of thermal expansion of the adhesive sheet at 100-250° C. after heat treatment at 380° C. for 30 seconds under tension of 20 kg/m is not more than 2.5 ppm in the tension direction and not more than 10 ppm in the direction perpendicular to the tension direction.

5 Claims, No Drawings

ADHESIVE SHEET AND COPPER-CLAD LAMINATE

TECHNICAL FIELD

The present invention relates to an adhesive film that is preferably applicable to a two-layer FPC having a high dimensional stability.

BACKGROUND ART

The recent trends toward lighter, smaller, and higher-density electronic products have increased the demand for various printing boards. In particular, the demand for flexible laminates (also referred to as "flexible printing circuit boards (FPCs)") has shown a notable increase. A flexible laminate is constituted from an insulating film and a circuit formed from a metal foil disposed on the film.

Typically, a flexible laminate is produced by bonding a metal foil onto a surface of a substrate with an adhesive material of various kinds under heating and pressure, the substrate being a flexible film made from an insulating material of various kinds. Polyimide films and the like are preferred as the insulating flexible film, and thermosetting adhesives such as epoxy and acrylic adhesives are typically used as the adhesive material. Hereinafter, FPCs made using thermosetting adhesives are also referred to as "three-layer FPCs".

Thermosetting adhesives are advantageous in that bonding at relatively low temperatures is possible. However, requirements for properties, such as heat resistance, flexibility, and electrical reliability, are becoming more stringent, and it is possible that three-layer FPCs using thermosetting adhesives will have difficulty in meeting these stringent requirements. In order to overcome this problem, FPCs (hereinafter also referred to as "two-layer FPCs") using thermoplastic polyimide as the bonding layer or made by directly forming a metal layer on the insulating film have been proposed. The two-layer FPCs have properties superior to those of the three-layer FPCs, and the demand for the two-layer FPCs is expected to grow in the future.

The two-layer FPCs that have been suggested are classified into three types, (1) PVD two-layer, (2) cast two-layer, (3) laminate two-layer, which have various advantages and disadvantages respectively. Among theses three types of two-layer FPCs, the laminate two-layer FPC gains prominence over the others because of its high productivity. The laminate two-layer FPC is produced by laminating an electrically conductive metal foil on an adhesive sheet on one or each side of which an polyimide-based adhesive agent layer is formed. As an example of the PVD two-layer FPC, Patent Citation 2 discloses a flexible copper-clad circuit board in which a thermoplastic polyimide layer and a certain metal layer, namely, a copper layer, are formed on a thermosetting polyimide film. The metal layer is formed directly thereon by sputtering or plating. These methods, however, cannot provide sufficient adhesiveness between the thermoplastic polyimide layer and the metal layer.

Moreover, the two-layer FPC is generally required to have (i) a high soldering heat resistance to cope with lead-free soldering, and (ii) a dimensional stability to cope with high density packaging. The laminating step for the laminate two-layer FPC should utilize high temperature and high pressure because the adhesive is made of polyimide having high melting point. The high temperature and the high pressure deteriorate the dimensional change ratio after etching and after heat treatment. Various attempts have been made to attain better dimensional stability. For Example, Patent Citation 1 discloses a method in which a surface of a polyimide film is mechanically roughed before the polyimide film is laminated with an adhesive and a copper. Moreover, Patent Citation 3 discloses a copper-clad laminate that is developed to cope with high temperature at lamination. The copper-clad laminate of Patent Citation 3 uses a multi-layer polyimide film integrally comprising a substrate polyimide layer that is low in heat expansion, and a thin-layer polyimide on both sides of the substrate polyimide layer, each thin-layer polyimide having particular structure and Tg. The art disclosed in Patent Citation 3 is characterized in its step of providing an adhesive agent layer, and in the adhesive agent layer itself. Thus, the art disclosed in Patent Citation 3 does not provide a fundamental improvement in dimensional stability and its dimensional stability remained insufficient.

Patent Citation 1: Japanese Unexamined Patent Application Publication, Tokukaihei, No. 6-232553

Patent Citation 2: Japanese Unexamined Patent Application Publication, Tokukai, No. 2002-280684

Patent Citation 3: Japanese Unexamined Patent Application Publication, Tokukai, No. 2003-71982

DISCLOSURE OF INVENTION

Technical Problems

The present inventions is accomplished in view of the aforementioned problems. An object of the present invention is to provide an adhesive sheet suitable for use in FPC that is obtainable by laminating a copper foil and the adhesive sheet. Especially, an object of the present invention is to provide an adhesive sheet suitable for use in a laminate two layer FCCL in which an insulating layer and the adhesive layer are made of polyimides, and a copper-clad laminate using the same. That is, the present invention is:

(1) An adhesive sheet comprising an insulating layer and an adhesive layer on one or each side of the insulating layer, wherein the insulating layer has a storage elasticity modulus ratio $E'2/E'1$ of 0.2 or less where $E'1$ is a storage elasticity modulus at 25° C. and $E'2$ is a storage elasticity modulus at 380° C., the insulating layer has a coefficient of thermal expansion in the MD direction in a range of 5 to 15 ppm from 100° C. to 200° C., and a change in the coefficient of thermal expansion of the adhesive sheet from 100° C. to 250° C. is 2.5 ppm or less in a tension direction in which the tension is applied, and a change in the coefficient of thermal expansion of the adhesive sheet from 100° C. to 250° C. is 10 ppm or less in a direction perpendicular to the tension direction, where the change in the coefficient of thermal expansion is calculated by Equation (1):

$$\text{Change in Coefficient of Thermal Expansion} = |(\text{First Measured Value of Coefficient of Thermal Expansion}) - (\text{Second Measured Value of Coefficient of Thermal Expansion})| \quad (1)$$

where the measurements are carried out with the adhesive sheet that has been heat-treated at a temperature of 380° C. for 30 sec under tension of 20 kg/m.

(2) The laminate adhesive sheet as set forth in (1) wherein a peak top temperature of tan δ in measuring dynamic viscoelasticity of the insulating layer is in a range of 300 to 400° C., and tan δ>0.1.

(3) The adhesive sheet as set forth in (1) or (2), wherein the insulating layer is a polyimide layer.

(4) The adhesive sheet as set forth in (3), wherein raw materials of the polyimide layer include 2,2-bisaminophenoxyphenylpropane by 10 to 50 mol %, p-phenylenediamine by 30 to 60 mol %, and an oxydianiline by 10 to 30 mol % with respect to a diamine component.

(5) The adhesive sheet as set forth in (4), wherein the oxydianiline is 3,4'-oxydianiline.

(6) The adhesive sheet as set forth in (3) to (5) wherein the raw materials of the polyimide layer includes pyromellitic dianhydride by 60 to 95 mol %, and 3,3',4,4'-benzophenonetetracarboxylic dianhydride and/or 3,3',4,4'-biphenyltetracarboxylic dianhydride by 5 to 40 mol % with respect to an acid dianhydride component.

(7) The adhesive sheet as set forth in (1) to (6), wherein the adhesive layer contains a polyimide-based adhesive.

(8) The adhesive sheet as set forth in (1) to (7), wherein the adhesive layer contains a straight-chained thermoplastic polyimide and/or a 3-dimensionally crosslinking polyimide.

(9) The adhesive sheet as set forth in (1) to (8), wherein the adhesive sheet is used after being laminated with a metal layer on one or each adhesive layer by applying heat and pressure.

(10) A two-layer copper-clad laminate prepared by laminating a metal conductive foil on one or each side of adhesive sheet as set forth in (1) to (9) by applying heat and pressure.

Technical Solution

As a result of diligent studies to attain the object, the inventors of the present invention found that an adhesive sheet having particular properties makes it possible to produce a CCL (Copper-Clad Laminate) with a high dimensional stability. The present invention is accomplished based on the finding.

Effect of Invention

The present invention makes it possible to produce a CCL with a high dimensional stability. More specifically, the high dimensional stability thus attained makes it possible to cope with finer wiring pattern and multi-layered structure required for high-density packaging. Moreover, the present invention solves the low adherability problem associated with the use of thermoplastic polyimide as an adhesive. Thus, the present invention makes it possible to cope with a higher reflow temperature required by lead-free soldering.

BEST MODE FOR CARRYING OUT THE INVENTION (Property of Adhesive Sheet of Present Invention)

An adhesive sheet of the present invention includes an insulating layer and an adhesive layer on one or each side of the insulating layer. By specifying the properties of the insulating layer and adhesive sheet, it is possible to suppress a dimensional change that occurs in a step of producing a CCL by applying heat and pressure on the adhesive sheet and a metal foil. More specifically, the inventors of the present invention considers that (1) storage elasticity modulus of the insulating layer, (2) coefficient of thermal expansion of the insulating layer, and (3) coefficient of thermal expansion of the adhesive sheet are important. As a result of diligent works, the inventors of the present invention found that it is possible to produce a CCL excellent in dimensional stability by appropriately designing the adhesive sheet in these values (1) to (3).

To begin with, the storage elasticity modulus of the insulating layer is specified in the present invention. It is important that $E'2/E'1$ be 0.2 or less, where $E'1$ is a storage elasticity modulus at 25° C. and $E'2$ is a storage elasticity modulus at 380° C. The reasons why the storage elasticity modulus at 25° C. and storage elasticity modulus at 380° C. are used as the indicators are as follows. Firstly, the inventors of the present invention found that the adhesive sheet needs a high elasticity around room temperatures in order to reduces influences of tension that would occur in processing the adhesive sheet. Secondly, the inventors of the present invention found that the adhesive sheet needs a low elasticity modulus at a processing temperature in order to alleviate distortion that would occur in laminating the adhesive sheet. The ratio of the storage elasticity modulus can be an indicator to show how much the resin will be softened in heating, that is, in laminating. The resin smaller in the ratio of the storage elasticity modulus is easier to be softened. In the present invention, the ratio is preferably 0.2 or less, more preferably not less than 0.04 but not more than 0.2, and especially not less than 0.06 but not more than 0.18. If the ratio is above the range, the dimensional stability will be poor. If the ratio is below the range, the dimensional stability will be improved but it will become difficult to perform continuous film formation. The storage elasticity modulus can be worked out from dynamic viscoelasticity.

In the present invention, a coefficient of thermal expansion in an MD direction (machine direction to transfer the sheet) is also specified. The coefficient of thermal expansion in the MD direction from 100° C. to 200° C. is in a range of 5 to 15 ppm in the present invention. If the insulating layer has a coefficient of thermal expansion in the MD direction above the range, the adhesive sheet cannot be designed to have an adhesive agent layer with a sufficient thickness. This will make it impossible to secure tight adhesion between the adhesive sheet and a metal conductive foil. If the insulating layer has a coefficient of thermal expansion in the MD direction below the range, the dimensional stability in fully etching the CCL will be poor.

While the present invention designs the insulating layer such that the storage elasticity modulus and the coefficient of thermal expansion satisfy the ranges, the properties of the insulating layer can be worked out from the CCL. That is, the coefficient of thermal expansion of the insulating layer in the CCL may be measured by I) measuring the coefficient of thermal expansion of the insulating layer isolated from the CCL by etching away the metal layer and adhesive agent layer, II) a coefficient of thermal expansion of the insulating layer isolated from the CCL by physically removing the adhesive agent layer completely by using a knife or the like, or (III) the like method.

Furthermore, the coefficient of thermal expansion of the adhesive sheet is specified in the present invention. The coefficient of thermal expansion of the adhesive sheet is measured after treating the adhesive sheet with a temperature of 380° C. for 30 seconds under tension of 20 kg/m. The tension of 20 kg/m is applied in the measurement because the application of such a tension simulates distortion that would occur in the adhesive sheet in the step of processing. The heat of 380° C. is applied for 30 seconds in the measurement, because such heat application certainly preserve the distortion in the adhesive sheet. Moreover, specified is an absolute value of a difference between a first measured value of the coefficient of thermal expansion and a second measured value of the coefficient of thermal expansion, because the absolute value indicates a degree of releasing accumulated distortion.

Change in Coefficient of Thermal Expansion=|(First Measured Value of Coefficient of Thermal Expansion)−(Second Measured Value of Coefficient of Thermal Expansion)|    (1)

The change in the coefficient of thermal expansion of the adhesive sheet from 100° C. to 250° C. is measured according to Equation 1. The change in the coefficient of thermal expansion of the adhesive sheet from 100° C. to 250° C. is 2.5 ppm or less, preferably 2 ppm or less in the direction in which the tension is applied (this direction is the MD direction in general). Meanwhile, the change in the coefficient of thermal expansion of the adhesive sheet from 100° C. to 250° C. is 10 ppm or less, and preferably 8 ppm or less in a direction perpendicular to the application of the tension (this direction is the TD direction in general). If the change in the coefficient of thermal expansion of the adhesive sheet was above the range, the dimensional change in heating the CCL at 250° C. after fully etching the CCL would be extremely large.

There is no particular limitation in sheet size, heat treatment method, etc. for the heat treatment of 380° C. for 30 seconds under tension of 20 kg/m, provided that the tension is kept being applied until the heat-treated sample is cooled down to room temperatures. Moreover, in case where the adhesive agent layer is made of a thermally reactive adhesive agent such as polyimide, the heat treatment may be utilized as the step of reacting the thermally reactive adhesive agent. Moreover, the change in the coefficient of thermal expansion of the adhesive sheet of the present invention may be measured by measuring a pre-lamination adhesive sheet thus heat-treated, or measuring an adhesive sheet thus heat-treated after completely removing an electrically conductive layer from a post-lamination adhesive sheet.

A special care must be paid in case where a 3-dimensional cross-linking type adhesive agent is used. To be measured in the manner mentioned above, the reaction in the adhesive agent layer must be completed or proceeded to such an extent that the adhesive agent layer become practically usable. Thus, in this case it is preferable to measure an adhesive sheet thus heat-treated after completely removing an electrically conductive layer from a post-lamination adhesive sheet The property of the adhesive sheet can be confirmed by testing a CCL from which the conductive layer is removed by, e.g., etching.

One preferable embodiment of the present invention is described below. It is preferable that a peak top temperature of tan δ in measuring dynamic viscoelasticity of the insulating layer be in a range of 300 to 400° C. It is especially preferable that the peak top temperature of tan δ in measuring dynamic viscoelasticity of the insulating layer be in a range of 320 to 370° C. It is preferable that tan δ>0.1. If the peak top temperature of tan δ was below the range, the insulating layer would have a glass transition temperature of less than 250° C. and accordingly become poor in the heat resistance. If the peak top temperature of tan δ was above the range, this would result in a large dimensional change in heating. If tan δ≦0.1, the softening around the process temperature would tend to be insufficient to alleviate the distortion.

There has been no adhesive sheet satisfying all the properties. The inventors of the present invention firstly found such an adhesive sheet and confirmed its effect.

(Insulating Layer of Adhesive Sheet of Present Invention)

The insulating layer of the present invention may be made of any organic material having an excellent insulating property, such as polyimide, polyamideimide, polyester, polyamide, liquid crystal polymers, etc. Among them, polyimide and liquid crystal polymers are preferable to use, considering heat resistance.

The polyimide to be used as the insulating layer of the present invention is prepared from a polyamic acid as a precursor. The polyamic acid may be produced by any methods known as methods for producing polyamic acid. In general, an aromatic dianhydride and an aromatic diamine in substantially equimolar amounts are dissolved in an organic solvent thereby to prepare a solution in which the polyamic acid is dissolved in the organic solvent. The solution is stirred under controlled temperature condition until polymerization of the acid dianhydride and the diamine is completed. In this way, the polyamic acid is prepared. The polyamic acid solution is obtained at a concentration generally in a range of 5 to 35 wt %, and preferably in a range of 10 to 30 wt %. The polyamic acid solution in this range has an appropriate molecular weight and appropriate solution viscosity.

Various known processes and combinations of these processes may be employed as the polymerization process. The key feature of the polymerization process for producing polyamic acid is the order of adding the monomers. The properties of the resulting polyimide are adjusted by controlling the order of adding the monomers. Thus, in the present invention, any process of adding monomers may be employed for producing the polyamic acid. Representative examples of the polymerization processes are as follows:

1) After the aromatic diamine is dissolved in an organic polar solvent, the aromatic tetra carboxylic dianhydride in an amount substantially equimolar to the aromatic diamine is added thereto and then the aromatic diamine and the aromatic tetra carboxylic dianhydride are reacted for polymerization.

2) The aromatic tetra carboxylic dianhydride and the aromatic diamine compound (in an amount less in mole than the aromatic tetra carboxylic dianhydride) are reacted with each other in the organic polar solvent in order to obtain a solution of a prepolymer in the organic polar solvent, the prepolymer having an acid anhydride group on both ends. Next, to the solution of the prepolymer, an aromatic diamine compound is added in an amount that makes up the equimolar amount of aromatic diamine compound in an overall process with respect to the aromatic tetra carboxylic dianhydride. Then polymerization is carried out.

3) The aromatic tetra carboxylic dianhydride and the aromatic diamine compound (in an amount greater in mole than the aromatic tetra carboxylic dianhydride component) are reacted with each other in the organic polar solvent, thereby to obtain a solution of a prepolymer in the organic polar solvent, the prepolymer having an amino group on both ends. Next, to the solution of the prepolymer, aromatic diamine compound is further added and then an aromatic tetra carboxylic dianhydride is added in an amount that makes up the equimolar amount of the aromatic tetra carboxylic dianhydride in an overall process with respect to the aromatic diamine compound. Then polymerization is carried out.

4) After the aromatic tetra carboxylic dianhydride is dissolved and/or dispersed in the organic polar solvent, the aromatic diamine compound in an amount substantially equimolar to the aromatic tetra carboxylic dianhydride is added thereto and then the aromatic tetra carboxylic dianhydride and the aromatic diamine compound are reacted for polymerization.

5) The aromatic tetra carboxylic dianhydride and the aromatic diamine in substantially equimolar amounts are dissolved in the organic polar solvent and reacted for polymerization.

These methods may be employed solely or partially in combination. The method for producing the polyimide film is described, referring to a case where the insulating layer is used as a polyimide film by way of example.

The polyimide film may be produced from these polyamic acid solutions in any conventionally known methods, which encompass thermal imidization method and chemical imidization method. Either method may be employed to produce the film. However, the chemical imidization method may be more easy to obtain a polyimide film having the various properties that are preferable in the present invention.

In the present invention, it is especially preferable that the production process of the polyimide film include:

a) reacting an aromatic diamine and an aromatic tetracarboxylic dianhydride in an organic solvent, so as to obtain a polyamic acid solution;

b) flow-casting, on a support, a film formation dope containing the polyamic acid solution;

c) heating the film formation dope on the support and removing a gel film from the support; and d) further heating the gel film so as to imidize residual amic acid and dry the gel film.

In the above process, a curing agent containing a dehydrating agent or an imidization catalyst. Typical examples of the dehydrating agent include acid anhydrides such as acetic anhydride. Typical examples of the imidization catalyst include tertiary amines such as isoquinoline, β-picoline, pyridine, etc.

In the following, a preferable embodiment is described to explain the production process of the polyimide film. In the embodiment, the chemical imidization is explained for example. It should be noted that the present invention is not limited to the following arrangement descried by way of example, and the film formation condition and heating condition may be varied as appropriate according to the kinds of the polyamic acid, film thickness, etc.

The dehydrating agent and imidization catalyst may be added into the polyamic acid solution at a low temperature thereby to prepare a film formation dope. Then, the film formation dope is cast on a support such as a glass board, an aluminum foil, endless stainless-steel belt, stainless-steel drum, or the like, thereby forming a film thereof on the support. The film on the support is heated in a temperature in arrange of 80° C. to 200° C., preferably in a range of 100° C. to 180° C. in order to activate the dehydrating agent and the imidization catalyst. Thereby, the film is partially cured and/or dried. Then, the film is removed from the support thereby obtaining a polyamic acid film (hereinafter this film is referred to as a gel film).

The gel film is in an intermediate state in the curing of the polyamic acid to the polyimide. The gel film is a self-supportive film. A volatile content of the gel film is expressed as formula (2):

$$(A-B) \times 100/B \quad (2)$$

where A is a weight of the gel film, and B is a weight of the gel film after heated at 450° C. for 20 min.

The volatile content of the gel film is in a range of 5 to 500 wt. %, preferably in a range of 5 to 200 wt. %, and more preferably in a range of 5 to 150 wt. %. It is preferable to use a film in these ranges. In a baking process, there is a risk of film breakage, lack of uniformity in color tone of the film due to unevenly drying the film, and property variation, etc.

The amount of the dehydrating agent is in a range of 0.5 to 5 mol, and preferably in a range of 1.0 to 4 mol per unit of amic acid in the polyamic acid. Moreover, the amount of the imidization catalyst is in arrange of 0.05 to 3 mol, and preferably in a range of 0.2 to 2 mol per unit of amic acid in the polyamic acid.

The chemical imidization would be insufficient when the amounts of the dehydrating agent and imidization catalyst are below the ranges. The insufficient chemical imidization would results in the film breakage during the baking or low mechanical strength. On the other hand, the imidization would proceed too fast when the amounts of the dehydrating agent and imidization catalyst are above the ranges. The too-fast imidization would make it difficult to cast the solution into the film-like shape.

The gel film held at its ends is dried. By being held at its ends, the gel film can avoid the shrinkage due to the curing. The drying removes water, residual solvent, residual converting agent, and catalyst from the film, and completes the imidization of the residual amic acid. Thereby, the polyimide film of the present invention can be obtained.

The drying is preferably carried out at a temperature in a range of 400 to 650° C. for a time period in a range of 5 to 400 sec. Drying carried out at a temperature higher than the range and/or for a time period longer than the range would possibly cause thermal deterioration in the film. On the other hand, drying carried out at a temperature lower than the range and/or for a time period shorter than the range would possibly fail to attain the desired effect.

Moreover, the heat treatment of the film may be carried out with the film stretched at a lowest tension necessary for conveying the film. This lowers an internal stress remained in the film. The heat treatment may be carried out during the film production process, or may be carried out in addition to the process. The heating condition cannot be specified because the heating condition varies depending on film property or apparatus to use. The internal stress can be alleviated by heating at a temperature generally not less than 200° C. but not more than 500° C., preferably not less than 250° C. but not more than 500° C., especially preferably not less than 300° C. but not more than 450° C., for a time period in a range of 1 to 300 sec, preferably in a range of 2 to 250 sec, and especially preferably in a range of 5 to 200 sec.

Moreover, the film may be stretched before or after the fixing the gel film to the frame. For this stretching, the film has a volatile content in a range of 100 to 500 wt. %, and preferably in a range of 150 to 500 wt. %. Volatile content below the range would make it difficult to extend the film. Volatile content above the range causes the film to be poor in self-supporting property, which makes it difficult the stretching operation.

The stretching operation may be carried out by using any known method, encompassing a method using differential rollers are used, a method widening a gap of a tenter, etc.

Moreover, in case where the polyimide-based adhesive agent is used as the adhesive agent layer, the adhesive agent layer and the insulating layer are formed concurrently by using die or the like for a multi-layer concurrent extrusion.

Described below are monomers from which the polyimide film usable as the insulating layer of the present invention is produced. In the present invention, a diamine component preferably include 2,2-bisaminophenoxyphenylpropane and/or p-phenylenediamine. In general, the use of the p-phenylenediamine in a greater amount tends to increase the elasticity modulus and storage elasticity modulus and tan δ peak top temperature, while lowering the coefficient of thermal expansion. Meanwhile, the use of 2,2-bisaminophenoxyphenylpropane in a greater amount lowers the elasticity modulus and storage elasticity modulus while increasing the coefficient of thermal expansion. The use of 2,2-bisaminophenoxyphenylpropane in a greater amount also decreases water absorption and increases adherability. The use of an oxydianiline in combination therewith tends to increase the adherability further. Thus, it is preferable to use oxydianiline in addition. In the case where the oxydianiline is also used, it is preferable for easy balancing the coefficient of thermal expansion that the diamine component contain 2,2-bisaminophenoxyphenylpropane by 10 to 50 mol %, p-phenylenediamine by 30 to 60 mol %, and the oxydianiline by 10 to 30 mol %.

Examples of oxydianiline encompass 4,4'-oxydianiline, 3,4'-oxydianiline, 3,3'-oxydianiline, 2,4'-oxydianiline, and so on. Among these, 3,4'-oxydianiline is preferable, because the use of 3,4'-oxydianiline tends to make it easier to attain the object. The use of the diamine component as described above by way of example makes it easier to adjust the storage elasticity modulus ratio E'2/E'1 and the coefficient of thermal expansion in the MD direction from 100° C. to 200° C.

As an acid component, it is preferable to use pyromellitic dianhydride and 3,3'4,4'-benzophenonetetracarboxylic dianhydride. A preferable ratio to use them is such that pyromellitic dianhydride is in a range of 60 to 95 mol %, and 3,3'4,4'-benzophenonetetracarboxylic dianhydride is in a range of 5 to 40 mol %. If the ratio was out of the range, the adhesion strength would be lowered, or the coefficient of thermal expansion would be too large. The use of the acid dianhydride component described above by way of example makes it easier to adjust the storage elasticity modulus ratio E'2/E'1 and the coefficient of thermal expansion in the MD direction from 100° C. to 200° C.

Example 1 of Japanese Unexamined Patent Application Publication, Tokukai, No. 2000-80178 describes a polyimide film having the preferable composition of the present invention. Example 1 of Japanese Unexamined Patent Application Publication, Tokukai, No. 2000-80178 is silent as to an adhesive film and its property. A film was prepared according to Example 1 of Japanese Unexamined Patent Application Publication, Tokukai, No. 2000-80178, and properties of the adhesive film thus prepared were measured. This proved that the properties of the adhesive film prepared according to Example 1 of Japanese Unexamined Patent Application Publication, Tokukai, No. 2000-80178 were out of the range of the present invention.

Any solvents in which the polyimide precursor (hereinafter, referred to as the polyamic acid) is soluble can be preferably used as the solvent for the synthesis of the polyamic acid. Amide-based solvents, such as N,N-dimethylformamide, N,N-dimethylacetoamide, N-methyl-2-pyrorridone, may be used as the solvent. Especially, N,N-dimethylformamide, and N,N-dimethylacetoamide are preferable.

Moreover, the polyamic acid, which is the precursor of the polyimide of the present invention, may be prepared by any polymerization method such as these polymerization methods (1) to (5) mentioned above by way of example. However, it is preferable to prepare the polyamic acid by the following polymerization method, in order to make it easier to control the storage elasticity modulus ratio E'2/E'1 and the coefficient of thermal expansion in the MD direction from 100° C. to 200° C. in the polyimide film finally obtained. The preferable polymerization method includes the steps of:

(A) reacting the aromatic dianhydride component and the aromatic diamine component in an organic polar solvent in such a manner that either the aromatic dianhydride component or the aromatic diamine component is greater in molar amount than the other, so as to obtain a flexible prepolymer having an amino group or an acid dianhydride group on both ends.

(B) synthesizing a polyamic acid solution from the prepolymer obtained in Step (A), an acid anhydride component, and a diamine component in such an amount to make up substantially equimolar amounts of the acid anhydride component, and the diamine component, wherein the diamine component used in Step (A) and acid anhydride component are selected such that an equimolar reaction of the diamine component and acid anhydride component will produce a thermoplastic polyimide, and the polyamic acid obtained in Step (B) is a precursor of a non-thermoplastic polyimide.

To obtained the polyimide film, it is preferable to flow-cast, on a support, a film formation dope solution containing the polyamic acid solution, and then perform chemical and/or thermal imidization for the film formation dope solution. As described above, the block component derived from the thermoplastic polyimide is prepared in Step (A). In the present invention, the "block component derived from the thermoplastic polyimide" is such a block component that a film made from a polymer prepared therefrom will melt by heat application of a temperature in a range of 250 to 500° C., thereby losing its film shape. More specifically, the diamine component and the acid anhydride component are selected by checking whether a polyimide prepared from an equimolar reaction of the diamine component and acid anhydride component is melt at the temperature or lose its film shape. Moreover, judging whether the polyimide is the non-thermoplastic or not may be carried out by heating a film thereof to a temperature approximately in a range of 450 to 500° C. and checking whether or at the temperature it does not melt to lose its film shape. If the film shape is maintained, it would be judged that it is non-thermoplastic.

With the arrangement in which the size of the block component derived from the thermoplastic polyimide is adjusted and the polyamic acid obtained in Step (B) is non-thermoplastic, it becomes easier to adjust the storage elasticity modulus ratio E'2/E'1, the coefficient of thermal expansion in the MD direction, the peak top temperature of tan δ, and tan δ. Especially, by using, in combination, the diamine component and the acid anhydride component mentioned above by way of example, it becomes much easier to control the storage elasticity modulus ratio E'2/E'1, the coefficient of thermal expansion coefficient in the MD direction, the peak top temperature of tan δ, and tan δ.

Depending on the kind of monomers to use, the kind of polymerization method to adopt, and differences in film formation conditions, and combinations thereof, the polyimide film of the present invention will be varied in storage elasticity modulus ratio E'2/E'1, the coefficient of thermal expansion in the MD direction, the peak top temperature of tan δ, and tan δ. However, these property values can be easily measured. Thus, a desired film may be designed through checking properties of films prepared considering the above-described tendencies.

Moreover, a filler may be added in order to attain better film properties such as slidability, heat conductivity, electric conductivity, corona resistance, loop stiffness, etc. Any kind of filler may be used. Preferable examples of the filler encompass silica, titanium oxide, alumina, silicon nitride, boron nitride, dibasic calcium phosphate, calcium phosphate, mica, and the like.

The diameter of the filler particles may be determined based on the film properties to be modified and the type of filler, and is thus not particularly limited. The average particle diameter is usually 0.05 to 100 μm, preferably 0.1 to 75 μm, more preferably 0.1 to 50 μm, and most preferably 0.1 to 25 μm. When the average diameter is below this range, the effect of modification is not readily exhibited. At an average diameter beyond this range, the surface quality and/or the mechanical properties may be significantly degraded. The amount of the filler to be added is determined based on the film properties to be modified and the diameter of the filler particles and is thus not particularly limited. The amount of the filler added is usually 0.01 to 100 parts by weight, preferably 0.01 to 90 parts by weight, and more preferably 0.02 to 80 parts by weight per 100 parts by weight of polyimide. At a filler content below this range, the effect of the modification by the use of the filler may not be sufficiently exhibited. At a filler content beyond this range, the mechanical properties of the film may be significantly degraded.

The filler may be added by any method. The examples of the method include:

1. Method of adding the filler to the polymerization solution before or during the polymerization;
2. Method of adding and kneading the filler into the polymerization solution with a three-shaft roller after completion of the polymerization; and
3. Method including preparing a dispersion liquid containing the filler in advance and adding the dispersion liquid into a polyamic acid organic solvent solution.

Any method may be employed for the addition of the filler. However, the method including preparing a dispersion liquid containing the filler in advance and adding (especially right before the film formation) the dispersion liquid into a polyamic acid organic solvent solution is preferable because contamination of the production line with the filler in this method is least severe. In the preparation of the dispersion liquid, it is preferable to use the same solvent as the polymerization solvent of the polyamic acid. In order to sufficiently disperse the filler and stabilize the dispersion state, a dispersant, a thickener, or the like may be used in amounts that do not adversely affect the properties of the film.

(Adhesive Layer of Adhesive Sheet of Present Invention)

Any kind of adhesive layer may be adopted in the present invention. Considering the heat resistance, it is preferable to use a polyimide-type adhesive agent, especially, a strain-chained thermoplastic polyimide and/or a 3-dimensional crosslinking polyimide. Especially, the use of the 3-dimensional crosslinking polyimide significantly improves solder heat resistance. In case where the straight-chained thermoplastic polyimide is used, the adhesiveness and lamination processability can be improved by controlling molecular weight by using an end terminator such as phthalic acid compound, aniline-based compound, or the like. In case where the 3-dimensional cross-linking polyimide is used, it is preferable to use an end terminator having an acetylene group or vinyl group. For example, ethynyl phthalic acid compound, phenyl ethynyl phthalic acid compound, amino styrene, basic acid compound, chlorendic acid compound, maleic acid compound, or the like may be used.

The polyamic acid used in the present invention, which is the precursor of the thermoplastic polyimide, is not particularly limited and any polyamic acid may be used in the present invention. The polyamic acid solution may be produced with the raw materials, the production conditions, etc. described above.

The properties can be adjusted by various combining the raw materials to be used. In general, a greater ratio of a diamine having a rigid structure will increase the glass transition temperature and/or increases storage elastic modulus at heating. Accordingly, the adhesiveness and processability will be poor. Thus, a greater ratio of the diamine having a rigid structure is not preferable. The ratio of a diamine having a rigid structure is preferably 40 mol % or less, more preferably 30 mol % or less, and especially preferably 20 mol % or less. Moreover, an inorganic or organic filler may be added if necessary. the filler may be added in the same way as described above.

The adhesive layer may be prepared from the polyamic acid solution in any method. For example, the adhesive layer may be formed by flow-casting the polyamic acid solution on the polyimide film and/or a metal foil, and then performing drying and imidization. The adhesive layer may be formed by flow-casting the polyamic acid solution on a PET film or the like, and transferring the flow-cast on the polyimide film or metal foil. A thermoplastic polyimide film may be formed and used as an adhesive film, thereby providing the adhesive layer. The adhesive layer and the insulating layer may be formed concurrently by concurrent multi-layer extrusion etc. A polymer blend in which another resin is dissolved in the polyamic acid solution may be used. The formation of the adhesive layer is described below, discussing, by way of example, the method in which the adhesive layer is formed by flow-casting the polyamic acid solution on the polyimide film and/or a metal foil, and then performing drying and imidization.

The flow-casting to apply the polyamic acid on the polyimide film can be performed in any way, and performed by any conventional method, such as using die coater, reverse coater, blade coater, or the like. The thickness of the coating of the polyamic acid solution is not particularly limited, and can be adjusted as appropriate according to usage. However, too thick coating would easily cause some problems such as low productivity due to a need of a long curing time. Thus, it is preferable that the polyamic acid solution is coated such that the thickness of the coating will be 10 μm or less after the imidization.

In general, the polyimide is produced by imidizing the polyamic acid, which is the precursor thereof. The imidization is carried out thermally and/or chemically. Examples of a dehydrating agent for use in the chemical imidization encompass aliphatic anhydrides, aromatic acid anhydrides, N,N'-dialkylcarbodiimides, low alcohol halides, low aliphatic acid anhydride halides, aryl phosphoric dihalides, thionyl halide, and mixtures of two or more of them. For high availability and low cost, aliphatic acid anhydrides such as aceticanhydride, propionic anhydride, lactic anhydride, etc. and mixtures of two or more of them are preferable among these dehydrating agents.

Moreover, examples of an imidization catalyst encompass aliphatic tertiary amines, aromatic tertiary amines, heterocyclic tertiary amines, etc. For high reactivity as a catalyst, it is especially preferable to use a catalyst selected from among the heterocyclic tertiary amines. Typical examples of such imidization catalyst include tertiary amines such as quinoline, isoquinoline, β-picoline, pyridine, etc. Regardless of which method is adopted, heating is necessary for the imidization and/or drying. A higher heating temperature is preferable in terms of productivity because it facilitates and speeds up the imidization. However, if the heating temperature is too high, it would possibly cause thermolysis of the thermoplastic polyimide.

A too low heating temperature makes it difficult to proceed the imidization and prolongs the step of performing the imidization. For the thermal imidization, the heating temperature is preferably in a range of the glass transition temperature of the thermoplastic polyimide to a temperature higher than the glass transition temperature of the thermoplastic polyimide by 200° C., more preferably in a range of a temperature higher than the glass transition temperature of the thermoplastic polyimide by 50° C. to a temperature higher than the glass transition temperature of the thermoplastic polyimide by 150° C. Imidization period should be sufficient for substantially completing the imidization and drying, and but cannot be varied appropriately. In general, the imidization period is set as appropriate within a range of 1 to 600 seconds.

Moreover, the flowability of the adhesive layer when the adhesive layer is melted may be improved by intentionally keeping imidization ratio low and/or by intentionally remaining the solvent.

Tension to be applied during the imidization is preferably in a range 1 kg/m to 20 kg/m, and more preferably in a range of 5 kg/m to 15 kg/m. A tension below the range would lead to sagging during transportation. Such sagging would be a problem in the film winding. On the other hand, a tension above the range would be too high not to be influential on the dimensional change even if the metal foil is used.

The present invention specifies the coefficient of thermal expansion of the adhesive film after heat-treated at 380° C. for 30 seconds under tension application of 20 kg/m. The adhesive film is designed to be such that the change in the coefficient of thermal expansion from 100° C. to 250° C., which is calculated out in Equation (1) below, is 2.5 ppm or less in the tension direction, and 10 ppm or less in the direction perpendicular to the tension direction. To be such that the adhesive film is designed to have (i) a polyimide film whose storage elasticity modulus ratio E'2/E'1 is 0.2 or less, and whose coefficient of thermal expansion in the MD direction from 100 to 200° C. is in a range of 5 to 15 ppm, and (ii) the adhesive layer controlled in composition and thickness. Equation (1) for calculating out the change in the coefficient of thermal expansion from 100° C. to 250° C. is as follows:

Change in Coefficient of Thermal Expansion=|(First Measured Value of Coefficient of Thermal Expansion)−(Second Measured Value of Coefficient of Thermal Expansion)| (1)

The value calculated out by Equation (1) can be worked out by measuring the coefficient of thermal expansion. Adhesive films are prepared and tested to work out the change in the coefficient of thermal expansion, thereby determining final design of the adhesive film whose change in the coefficient of thermal expansion is 2.5 ppm or less in the tension direction and 10 ppm or less in the direction perpendicular to the tension direction. The inventors of the present invention are first to find out that the designing the adhesive film considering the change in the coefficient of thermal expansion can reduce the dimensional change in the production process of the FCCL.

(Metal Layer)

There is no particular limitation as to the metal layer for use in the present invention. To apply a flexible metal-clad laminate according to the present invention in electronic apparatus and electric apparatus, the metal foil may be, for example, copper, copper alloy, stainless steel or alloy thereof, nickel or nickel ally (including 42 alloy), or aluminum or aluminum alloy. The present invention can preferably employ rolled copper foil or electrolytic copper foil, which is widely used in general flexible metal-clad laminate. Moreover, anti-corrosive layer, heat resistant layer, or adhesive layer may be provided on a surface of the metal foil.

In the present invention, the metal foil is not particularly limited as to its thickness, provided that the metal foil with the thickness can sufficiently function for the usage to which it is applied. In generally, for example, the thickness of the metal foil is preferably in a range of 1 to 35 μm, more preferably in a range of 2 to 25 μm, and especially preferably in a range of 3 to 18 μm. A thickness thinner than the range would easily cause defective connection or low connection reliability in mounting on various substrates in which an anisotropic electrically conductive film or the like is used. A thickness thicker than the range would make it difficult to form fine wiring. Moreover, it may be arranged such that the lamination is carried out with the metal foil of a thicker thickness and then the thickness of the metal foil is thinned by a known method such as etching or the like.

(CCL Production)

The adhesive sheet of the present invention may be adhered together with the metal foil, for example, by continuous process using (i) a heat roll laminating apparatus having one pair or pairs of metal rolls or (ii) double belt press (DBP). Of them, the use of the heat roll laminating apparatus having one pair or pairs of metal roll is preferable due to its simple apparatus structure and low maintenance cost. The dimensional change easily occur in the lamination with the metal foil performed by using the heat roll laminating apparatus having one pair or pairs of metal roll. Thus, the polyimide film and the adhesive film of the present invention is significantly advantageous in such a lamination. The "heat roll laminating apparatus having one pair or pairs of metal rolls" can be any apparatus having metal rolls for heating and pressing a material, and is not particularly limited as to its specific apparatus arrangements.

Means for performing the thermal lamination is not particularly limited as to its specific arrangements. It is preferable to provide a protective material between the metal foil and a pressuring surface in order to give a better outer appearance to the laminate thus obtained. The protective material is not limited to a particular material, provided that the protective material can withstand against heating temperature of the thermal lamination process. Heat resistant plastics such as non-thermoplastic polyimide films and the like, and metal foils such as copper foil, aluminum foil, SUS foil, and the like, and the other material may be suitably employed as the protective material. Among them, the non-thermoplastic polyimide film is more preferable because it provides an excellent balance among the heat resistance, reusability, and the other factors. Moreover, the non-thermoplastic polyimide film is preferably 75 μm or more in thickness, because buffering and protection provided by a non-thermoplastic polyimide film with too thin thickness will not be sufficient.

Moreover, the protective material is not limited to a single layer and may have a multi-layer structure including two or more layers having different properties.

The materials to be laminated may be heated in any way by the thermal lamination means. For example, the thermal lamination may adopt any heating means using conventionally known method that can apply a predetermined temperature, such as heat circulation method, hot air heating method, induction heating method, etc. Similarly, the materials to be laminated may be pressured in any way by the thermal lamination means. For example, the thermal lamination may adopt any pressuring means using conventionally known method that can apply a predetermined pressure, such as hydraulic method, pneumatic method, gap-to-gap pressure method, etc.

The heating temperature in the thermal lamination step, that is, a lamination temperature is higher than the glass transition temperature (Tg) of the adhesive layer preferably by 50° C. or more, and more preferably by 100° C. or more. The lamination temperature higher than the glass transition temperature (Tg) of the adhesive layer preferably by 50° C. or more can attain good thermal lamination between the adhesive layer and the metal foil. Moreover, The lamination temperature higher than the glass transition temperature (Tg) of the adhesive layer preferably by 100° C. or more can increase lamination speed thereby improving the productivity.

The lamination speed in the thermal lamination process is preferably 0.5 m/min or higher, and more preferably 1.0 m/min or higher. The lamination speed of 0.5 m/min or higher allows sufficient thermal lamination while the lamination speed of 1.0 m/min or higher allows much better productivity.

The higher pressure (i.e., lamination pressure) in the thermal lamination can allow the use of a lower lamination temperature and a faster lamination speed. But too high lamination pressure worsens the dimensional change of the laminate generally. Moreover, too low lamination pressure results in a laminate in which the metal foil is adhered with a low adhesion strength. Thus, the lamination pressure is preferably in a range of 49 to 490N/cm (5 to 50 kgf/cm) and more preferably in a range of 98 to 294N/cm (10 to 30 kgf/cm). With the lamination pressure within these ranges, the three conditions, namely, the lamination temperature, the lamination speed, and the lamination pressure can be good and the productivity can be further improved. As to tension to be applied on the polyimide film during the lamination, the tension is preferably in a range of 0.01 to 2 N/cm, more preferably 0.02 to 1.5N/cm, and especially preferably 0.05 to 1.0N/cm. Application of a tension below the range will possibly make it difficult to attain a CCL having a good outer appearance. Meanwhile, application of a tension above the range tends to result in poor dimensional stability.

To attain the flexible metal-clad laminate according to the present invention, it is preferable to use a thermal lamination apparatus by which the materials to be laminated are adhered by pressure application while being continuously heated. Such a thermal lamination apparatus may include, in an upstream of the thermal lamination means, feeding means for feeding the materials to be laminated, and may include, in a down stream of the thermal lamination means, winding means for winding up the laminated materials. By providing these means, the productivity of the lamination apparatus is further improved. There is no particular limitation as to specific arrangement of the feeding means and the winding means. for example, a well-known roll-shaped winding apparatus or the like, which can wind up the adhesive film, metal foil, or the resultant laminate, may be adopted as the feeding means or the winding means.

Furthermore, it is more preferable to provide winding means for winding the protective material, or feeding means for feeding the protective material. By providing the means for winding the protective material and the means for feeding the protective material, the protective material can be winded up after being used, and provided to be refereed. Thereby, the protective material may be reused. Moreover, end-position detecting means and the winding position correcting means may be provided in order to align end sections of the protective material when the protective material is wound. This makes it possible to wind the protective material in a manner such that the end sections of the protective material is precisely aligned. This makes it possible to increase efficiency in reusing the protective material. There is no specific limitation in arrangements of the means for winding up the protective material, the means for feeding the protective material, the end position detecting means, and the winding position correcting means. Conventionally known various devices may be employed as the means for winding up the protective material, the means for feeding the protective material, the end position detecting means, or the winding position correcting means.

In the CCL obtained by the present invention, a dimensional changing ratio before and after the removal of the metal foil, and a total value of a dimensional changing ratio before and after the heat application of 250° C. for 30 min after the removal of the metal foil are very preferably within a range of −0.1 to +0.1 in both the MD direction and TD direction. The dimensional changing ratio before and after the removal of the metal foil is expressed by a ratio of a difference between predetermined dimensions of the flexible metal-clad laminate before and after the etching step over the predetermined dimension of the flexible metal-clad laminate before the etching step. The dimensional changing ratio before and after the heat application is expressed by a ratio of a difference between predetermined dimensions of the flexible metal-clad laminate before and after the heating step over the predetermined dimension of the flexible metal-clad laminate before the heating step.

The dimensional changing ratio of the range tends to result in high defective fraction in mounting devices on the flexible metal-clad laminate.

The measuring method for the dimensional changing ratios is not particularly limited. Any conventionally known method that can measure an increase and decrease in the dimension caused before and after the etching or heating step.

It is necessary to measure the dimensional changing ratios in both the MD direction and TD direction. In case the imidization and the lamination are performed continuously, the tension is applied differently in the MD direction and TD direction. Thus, the heat expansion and heat shrinkage occur at different extents in the MD direction and the TD direction. Thus, the dimensional changing ratios are different in MD directions and the TD directions. For a material with small dimensional changing ratios, it is necessary that the dimensional changing ratios be small in both the MD direction and the TD direction. In the present invention, a total value of (1) the dimensional changing ratios before and after the removal of the metal foil, and (2) the dimensional changing ratio before the heat application of 250° C. from 30 min is very preferably in the range of −0.1 to +0.1 in both the MD direction and TD direction.

Moreover, there is no particular limitation as to specific arrangement of the etching step for, measuring the dimensional changing ratios. That is, the etching conditions would be varied according to the kind of the metal foil, shape of pattern wiring to be formed, etc. Thus, in the present invention, the etching for measuring the dimensional changing ratios may be carried out under any conventionally known condition. Similarly, the heating step is not particularly limited, provided that the heating step applies a heat of 250° C. for 30 min.

EXAMPLE

The present invention will now be described in specifics by way of examples. It is to be understood that the present invention is not limited to these examples. Coefficients of thermal expansion of insulating layers, changes in coefficient of thermal expansion of adhesive sheets, and dynamic viscoelasticity of insulating layers were evaluated as follows.

(Coefficient of Thermal Expansion of Insulating Layer)

The coefficient of thermal expansion from 100° C. to 200° C. was measured by using TMA 120C made by Seiko Electronics Co. Ltd. A sample of 3 mm in width and 10 mm in length was heated from 10° C. to 400° C. at a rate of 10° C./min under 3 g load. Then, the sample was cooled down to 10° C. and then again heated at a rate of 10° C./min. Thermal expansion coefficients measured at 100° C. and 200° C. were measured in the second heating, and then averaged to work out the coefficient of thermal expansion from 100° C. to 200° C. The measurements were carried out under nitrogen atmosphere.

(Change in Coefficient of Thermal Expansion)

An adhesive sheet was cut out in size of 10×35 cm such that the MD direction was a longitudinal direction of the cut-out film. One end of the film was held by a jig, and a weight of 2 kg was hung from the other end thereby to apply a tension of 20 kg/m in the MD direction. The jig was put in an oven preheated to 380° C. and heat-treated for 30 seconds. After the heat treatment, the jig was taken out of the oven and then cooled down to a room temperature. After the weight was then removed, a piece of approximately 10×15 cm was cut out from a center portion of the film, and used as a measurement sample.

The change in the coefficient of thermal expansion from 100° C. to 200° C. was measured by using TMA 120C made by Seiko Electronics Co. Ltd. A sample of 3 mm in width and 10 mm in length was heated from 10° C. to 400° C. at a rate of 10° C./min under 3 g load (first measurement). Then, the sample was cooled down to 10 and then again heated to 400° C. at a rate of 10° C./min (second measurement). Thermal expansion coefficients measured at 100° C. and 250° C. were measured to find coefficients of thermal expansion in the first and second measurements. According to Equation (1), the change in the coefficient of thermal expansion was worked out.

Change in Coefficient of Thermal Expansion=|(First Measured Value of Coefficient of Thermal Expansion)−(Second Measured Value of Coefficient of Thermal Expansion)|     (1)

(Dynamic Viscoelasticity)

A ratio between storage elastic modulus at 25° C. and 380° C., tan δ, peak top temperature, and storage elastic modulus ratio, were measured under the following conditions by using DMS-600 made by Seiko Electronics Co. Ltd.
Temperature Profile: 0 to 400° C. (3° C./min)
Shape of Sample: 20 mm between holders, 9 mm in width.
Frequency: 5 Hz
Strain Amplitude: 10 μm
Minimum Tension: 100
Tension Gain: 1.5
Initial Value of Force Amplitude: 100 mN The storage elasticity modulus ratio was worked out from the following Equation:

(Storage Elasticity Modulus Ratio)=(Storage Elasticity Modulus at 380° C.)/(Storage Elasticity Modulus at 25° C.)

Synthetic Example 1

Synthesis of Thermoplastic Polyimide Precursor

To a 2,000 mL glass flask, 780 g of N,N-dimethylformamide (hereinafter, also referred to as DMF) and 115.6 of 2,2-bis[4-(4-aminophenoxy)phenyl]propane (BAPP) were added. While the resulting mixture was being stirred in a nitrogen atmosphere, 78.7 g of 3,3'4,4'-biphenyltetracarboxylic dianhydride (BPDA) was gradually added to the mixture. Subsequently, 3.8 g of ethylenebis(trimellitic acid monoester anhydride) (TMEG) was added, and the resulting mixture was stirred in an ice bath for 30 minutes. A solution of 2.0 g of TMEG in 20 g of DMF was separately prepared and gradually added to the reaction solution while monitoring the viscosity under stirring. The addition and the stirring were ceased when the viscosity reached 3,000 poise. A polyamic acid solution thereby obtained.

Example 1

Into 468 kg of N,N-dimethylformamide (hereinafter, DMF) cooled to 10° C., 29.94 kg of 2,2-bis(4-aminophenoxyphenyl)propane (BAPP) and 9.75 kg of 3,4'-oxydianiline(3, 4'-ODA) were dissolved. Then, 15.69 kg of 3,3',4,4'-benzophenonetetracarboxylic dianhydride (BTDA) was added and dissolved therein. After that, 13.27 kg of pyromellitic dianhydride (PMDA) was added. The mixture was stirred for 60 min, thereby preparing a prepolymer.

In the solution thus obtained, 13.16 kg of p-phenylenediamine (p-PDA) was dissolved. Then, 27.61 kg of PMDA was added therein and dissolved by 1 hour stirring. A solution of PMDA in DMF (weight ratio PMDA 1.59 kg/DMF 21.2 kg) was separately prepared and added into the resultant solution. The addition was ceased when the viscosity reached 3,000 poise. The solution was stirred for 3 hours. Thereby, a polyamic acid solution was obtained, which had a solid content of approximately 18.5 wt % and a rotational viscosity of 3400 poise at 23° C.

Into the polyamic acid solution, a chemical imidization agent containing 20.71 kg of acetic anhydride, 3.14 kg of isoquinoline, and 26.15 kg of DMF was added at a weight ratio of 50% with respect to the polyamic acid DMF solution and stirred quickly by a mixer, and then extruded via a T die to be flow-cast onto a stainless-steel endless belt running 15 mm below the die. Here, acetic anhydride used as a dehydrating agent, was in such a molar ratio that the acetic anhydride acting as the dehydrator was 2.5 and isoquinoline acting as a catalyst was 0.3 per one mole of amic acid of the polyamic acid varnish. The resin film thus formed was dried at 130° C. for 100 second and peeled off from the endless belt (volatile content 63 wt %). Then, the resin film was held at a tenter pin and heated in a tenter furnace at 300° C. for 20 sec, 450° C. for 20 sec, and 480° C. for 20 sec for drying and imidization. Thereby, a polyimide film was obtained. Properties of the film are shown on Table 1.

The polyamic acid solution obtained in Reference Example 1 was diluted with DMF to solid content of 10 wt %. Then, the polyamic acid was applied on both sides of the polyimide film in such a manner that thermoplastic polyimide layers (adhesive layers) would be 2 μm in thickness finally. Then, the laminate thus prepared was heated at 140° C. for 1 min. After that, the laminate under 4 kg/m tension was passed through an infra-red heater furnace of atmospheric temperature of 390° C. for 20 sec for thermal imidization. Thereby an adhesive sheet was obtained. An 18 μm rolled copper foil (BHY-22B-T, produced by Japan Energy Corporation) was laminated on each side of the resulting adhesive film, and then a protective material (Apical 125NPI produced by Kaneka Corporation) was laminated on each copper foil. The lamination was performed by thermal lamination under such conditions such that the tension applied on the polyimide film was 2N/cm; the laminating temperature was 360° C.; the laminating pressure was 196N/cm (20 kgf/cm); and the laminating speed was 1.5 m/min. Thereby, an FCCL was produced. Properties of the FCCL are shown on Table 1.

Examples 2 to 4

Polyimide films and FCCLs were prepared with different monomer ratios in the same manner as in Example 1. Properties of the films and FCCLs are shown on Table 1.

Comparative Examples 1 to 4

FCCLs were prepared with commercially-available polyimide films, namely Apical HP, Kapton EN, Apical NPI, Upilex S in the same manner as in Example 1. Properties of the films and FCCLs are shown on Table 1.

Comparative Example 5

A film was prepared according to Example 1 of Japanese Unexamined Patent Application Publication, Tokukai, No. 2000-80178, and FCCL was prepared in the same manner as in Comparative Examples 1 to 4. Properties of the film and FCCL are shown on Table 1.

TABLE 1

| | Ex. 1 | Ex. 2 | Ex. 3 | Ex. 4 | Com. Ex. 1 | Com. Ex. 2 | Com. Ex. 3 | Com. Ex. 4 | Com. Ex. 5 |
|---|---|---|---|---|---|---|---|---|---|
| Polymerization Recipe | BAPP 30<br>3,4'ODA 20<br>BTDA 20<br>PMDA 25<br>PDA 50<br>PMDA 55 | BAPP 30<br>3,4'ODA 20<br>BTDA 10<br>PMDA 35<br>PDA 50<br>PMDA 55 | BAPP 50<br>BTDA 15<br>PMDA 30<br>PDA 50<br>PMDA 55 | BAPP 30<br>4,4'ODA 20<br>BTDA 20<br>PMDA 25<br>PDA 50<br>PMDA 55 | Apical HP (Kaneka Corp.) | Kapton EN (Dupont-Toray Col. Ltd.) | Upilex S (Ube Industries Ltd.) | Apical NPI (Kaneka Corp.) | PDA 75<br>BAPP 25<br>BTDA 25<br>PMDA 75<br>Acetic anhydride 1 |
| Film Thickness μm | 10 | 10 | 10 | 10 | 10 | 12.5 | 20 | 20 | 10 |
| CTE in MD Direction ppm | 13 | 9 | 14 | 10 | 12 | 19 | 11 | 16 | 13 |
| SEMR | 0.10 | 0.15 | 0.07 | 0.15 | 0.06 | 0.04 | 0.23 | 0.33 | 0.25 |
| tan δ peak top | 341° C. | 357° C. | 348° C. | 359° C. | 317° C. | 335° C. | 325° C. | >400° C. | >400° C. |
| tan δ | 0.119 | 0.103 | 0.147 | 0.112 | 0.143 | 0.190 | 0.07 | — | — |
| Adhesive Thickness μm | 2 | 2 | 3 | 2 | 2 | 2 | 4 | 2.5 | 2 |
| CCTE MD | 0.6 | 0.4 | 1.7 | 0.7 | 2.8 | 1.0 | 1.5 | 1.0 | 2.1 |
| TD | 5.8 | 4.8 | 7.9 | 5.1 | 17.1 | 5.6 | 6.8 | 3.1 | 7.1 |
| DC (Etching) MD | 0.03 | 0.02 | 0.04 | 0.02 | −0.04 | −0.06 | −0.08 | −0.10 | −0.11 |
| TD | −0.02 | 0.03 | −0.03 | −0.03 | 0.09 | −0.01 | 0.15 | 0.27 | 0.22 |
| DC (250° C./30 min) MD | −0.02 | −0.03 | −0.05 | −0.02 | −0.13 | −0.07 | −0.04 | −0.05 | −0.04 |
| TD | 0.01 | 0.02 | 0.05 | 0.02 | 0.13 | −0.02 | 0.13 | 0.16 | 0.17 |
| DC in total MD | 0.01 | −0.01 | −0.01 | 0.00 | −0.17 | −0.13 | −0.12 | −0.15 | −0.15 |
| TD | −0.01 | 0.02 | 0.09 | −0.01 | 0.22 | −0.03 | 0.27 | 0.43 | 0.39 |

Abbreviations:
Ex. stands for "Example".
Com. Ex. stands for "Comparative Example".
CTE stands for "Coefficient of Thermal Expansion".
SEMR stands for "Storage Elasticity Modulus Ratio" and the SEMR is between 50° C. and 380° C.
CCTE stands for "Change in Coefficient of Thermal Expansion".
DC stands for "Dimensional Change".

Abbreviations: Ex. stands for "Example".
Corn. Ex. stands for "Comparative Example".
CTE stands for "Coefficient of Thermal Expansion".
SEMR stands for "Storage Elasticity Modulus Ratio" and the SEMR is between 50° C. and 380° C.
CCTE stands for "Change in Coefficient of Thermal Expansion".
DC stands for "Dimensional Change".

INDUSTRIAL APPLICABILITY

The present invention makes it possible to produce a CCL with a high dimensional stability. More specifically, the high dimensional stability thus attained makes it possible to cope with finer wiring pattern and multi-layered structure required for high-density packaging. Moreover, the present invention solves the low adherability problem associated with the use of thermoplastic polyimide as an adhesive. Thus, the present invention makes it possible to cope with a higher reflow temperature required by lead-free soldering.

The invention claimed is:

1. A method for producing a two-layer copper-clad laminate comprising laminating, by using a heat roll laminating apparatus, a metal conductive foil on both sides of an adhesive sheet comprising an insulating layer having a polyimide adhesive layer on each side of the insulating layer by applying heat and pressure, wherein
the insulating layer has a storage elasticity modulus ratio E'2/E'1 of 0.2 or less where E'1 is a storage elasticity modulus at 25° C. and E'2 is a storage elasticity modulus at 380° C.,
the insulating layer has a coefficient of thermal expansion in the machine direction in a range of 5 to 15 ppm from 100° C. to 200° C., and
a change in the coefficient of thermal expansion of the adhesive sheet from 100° C. to 250° C. is 2.5 ppm or less in a tension direction in which the tension is applied, and a change in the coefficient of thermal expansion of the adhesive sheet from 100° C. to 250° C. is 10 ppm or less in a direction perpendicular to the tension direction, where the change in the coefficient of thermal expansion is calculated by Equation (1):

Change in Coefficient of Thermal Expansion=|(First Measured Value of Coefficient of Thermal Expansion)−(Second Measured Value of Coefficient of Thermal Expansion)|  (1)

where the measurements are carried out with the adhesive sheet that has been heat-treated at a temperature of 380° C. for 30 sec under tension of 20 kg/m,
the insulating layer is a polyimide layer, and
the polyimide layer is manufactured using a solution of polyamic acid whose raw materials include 2,2-bisaminophenoxyphenylpropane by 10 to 50 mol %, p-phenylenediamine by 30 to 60 mol %, and an oxydianiline by 10 to 30 mol % with respect to a diamine component; and
wherein the adhesive sheet comprises adhesive layers on both sides of the insulating layer, and a metal conductive foil on both of the adhesive layers.

2. The method of claim 1, wherein a peak top temperature of tan δ in measuring dynamic viscoelasticity of the insulating layer is in a range of 300 to 400° C., and tan δ>0.1.

3. The method of claim 1, wherein the oxydianiline is 3,4'-oxydianiline.

4. The method of claim 1, wherein the raw materials of the polyimide layer include pyromellitic dianhydride by 60 to 95 mol %, and 3,3',4,4'-benzophenonetetracarboxylic dianhydride and/or 3,3',4,4'-biphenyltetracarboxylic dianhydride by 5 to 40 mol % with respect to an acid dianhydride component.

5. The method of claim 1, wherein the adhesive layer contains a straight-chained thermoplastic polyimide and/or a 3-dimensionally crosslinking polyimide.

* * * * *